United States Patent
Lindemann et al.

(10) Patent No.: US 10,756,689 B2
(45) Date of Patent: Aug. 25, 2020

(54) DYNAMIC LIMITING WHEN DRIVING HIGH CAPACITIVE LOADS

(71) Applicant: Cirrus Logic International Semiconductor Ltd., Edinburgh (GB)

(72) Inventors: Eric Lindemann, Boulder, CO (US); John L. Melanson, Austin, TX (US); Eric J. King, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/001,502

(22) Filed: Jun. 6, 2018

(65) Prior Publication Data

US 2018/0358945 A1 Dec. 13, 2018

Related U.S. Application Data (60) Provisional application No. 62/517,638, filed on Jun. 9, 2017, provisional application No. 62/532,431, filed
(Continued)

(51) Int. Cl.

| | |
|---|---|
| *H03G 5/02* | (2006.01) |
| *H03G 3/00* | (2006.01) |
| *H03G 7/00* | (2006.01) |
| *H03G 3/30* | (2006.01) |
| *H04R 3/04* | (2006.01) |
| *G10L 21/0272* | (2013.01) |
| *H03F 3/183* | (2006.01) |
| *H03G 11/00* | (2006.01) |
| *H03G 9/00* | (2006.01) |
| *H03F 3/217* | (2006.01) |

(Continued)

(52) U.S. Cl.
CPC ....... *H03G 3/3005* (2013.01); *G10L 21/0272* (2013.01); *H03F 1/0222* (2013.01); *H03F 3/183* (2013.01); *H03F 3/187* (2013.01); *H03F 3/2173* (2013.01); *H03G 3/002* (2013.01); *H03G 7/002* (2013.01); *H03G 9/005* (2013.01); *H03G 9/025* (2013.01); *H03G 11/00* (2013.01); *H04R 3/04* (2013.01); *G10L 25/21* (2013.01); *H03F 2200/03* (2013.01); *H03G 5/005* (2013.01); *H03G 5/165* (2013.01); *H04R 17/00* (2013.01)

(58) Field of Classification Search
CPC ...... H03G 3/3005; H03G 5/025; H03G 11/00; H03F 3/187; H03F 3/183; H03F 3/68; G06F 1/263; H04R 3/00; H04R 29/001; H04R 3/04; G10L 21/0272
USPC ..... 381/98, 123, 120, 59, 55, 107, 113, 111, 381/102, 104, 106, 94.8
See application file for complete search history.

(56) References Cited

U.S. PATENT DOCUMENTS

| | | | |
|---|---|---|---|
| 5,394,474 A * | 2/1995 | Hirai | G10H 1/0091 381/106 |
| 2008/0025530 A1* | 1/2008 | Romesburg | H03F 3/68 381/107 |

(Continued)

*Primary Examiner* — Vivian C Chin
*Assistant Examiner* — Ubachukwu A Odunukwe
(74) *Attorney, Agent, or Firm* — Jackson Walker L.L.P.

(57) ABSTRACT

A system may include an input configured to receive a first signal representative of a second signal to be driven to an amplifier input of an amplifier, processing circuitry configured to process the first signal in order to generate the second signal from the first signal such that the processing circuitry limits a current driven by the amplifier to an output load of the amplifier, and an output configured to drive the second signal to the amplifier input.

24 Claims, 7 Drawing Sheets

Related U.S. Application Data on Jul. 14, 2017, provisional application No. 62/535,394, filed on Jul. 21, 2017.

(51) Int. Cl.
*H03G 9/02* (2006.01)
*H03F 1/02* (2006.01)
*H03F 3/187* (2006.01)
H04R 17/00 (2006.01)
G10L 25/21 (2013.01)
H03G 5/00 (2006.01)
H03G 5/16 (2006.01)

(56) References Cited

U.S. PATENT DOCUMENTS

2009/0268918 A1* 10/2009 Solgaard ............... H03G 9/005
                                                          381/55
2011/0305356 A1* 12/2011 Kwan .................... H04R 3/04
                                                          381/190
2017/0359652 A1* 12/2017 Serwy .................... H03F 3/183
2018/0120884 A1* 5/2018 King .................. F04D 15/0027

\* cited by examiner

FIG. 8

US 10,756,689 B2

DYNAMIC LIMITING WHEN DRIVING HIGH CAPACITIVE LOADS

RELATED APPLICATION

The present disclosure claims priority to U.S. Provisional Patent Application Ser. No. 62/517,638, filed Jun. 9, 2017, to U.S. Provisional Patent Application Ser. No. 62/532,431, filed Jul. 14, 2017, and to U.S. Provisional Patent Application Ser. No. 62/535,394, filed Jul. 21, 2017, each of which is incorporated by reference herein in its entirety.

FIELD OF DISCLOSURE

The present disclosure relates in general to circuits for audio devices, piezoelectric devices, and/or haptic-feedback devices, including without limitation personal audio devices such as wireless telephones and media players, and more specifically, to dynamically limiting a signal for driving a transducer with a high capacitive load, including a piezoelectric transducer.

BACKGROUND

As electronic devices become more ubiquitous, a diverse array of functions, such as audio, video, graphics processing, and other functions are incorporated into electronic devices. In order to enhance versatility, such functions are incorporated into devices of reduced form factor and power consumption.

Audio functionality, for example, can be provided by way of transducers for converting electronic audio signals into audio. A variety of transducers are available for incorporation into electronic devices, such as coil transducers, electrostatic transducers, isodynamic transducers, and piezoelectric transducers. Piezo-electric transducers, for example, can provide numerous advantages in design of devices with audio functionality, such as reduced power consumption, a wide safe operating temperature range, excellent audio quality, and flexible design parameters allowing for reduced device form factor.

Transducers included in audio driver circuits of electronic devices may be limited in their ability to convert electronic audio signals to audio output. For example, the operation of an audio driver circuit may be limited at low frequencies by a voltage available to the circuit. The operation of audio driver circuits may also be limited at high frequencies, particularly in highly-capacitive transducer loads, by a current capacity and power supply available to the circuit. If an audio signal exceeds the operational parameters of the audio driver circuit, for example a maximum voltage, current, or power of an amplifier of the circuit, the audio signal may be clipped, cutting off audio above a maximum voltage or current threshold. Clipping of audio signals causes undesirable distortion, reducing the quality of the audio output from the electronic device.

SUMMARY

In accordance with the teachings of the present disclosure, one or more disadvantages and problems associated with existing approaches to driving a high capacitive load transducer may be reduced or eliminated.

In accordance with embodiments of the present disclosure, a system may include an input configured to receive a first signal representative of a second signal to be driven to an amplifier input of an amplifier, processing circuitry configured to process the first signal in order to generate the second signal from the first signal such that the processing circuitry limits a current driven by the amplifier to an output load of the amplifier, and an output configured to drive the second signal to the amplifier input.

In accordance with these and other embodiments of the present disclosure, a method may include receiving a first signal representative of a second signal to be driven to an amplifier input of an amplifier, processing the first signal in order to generate the second signal from the first signal in order to limit a current driven by the amplifier to an output load of the amplifier, and driving the second signal to the amplifier input.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
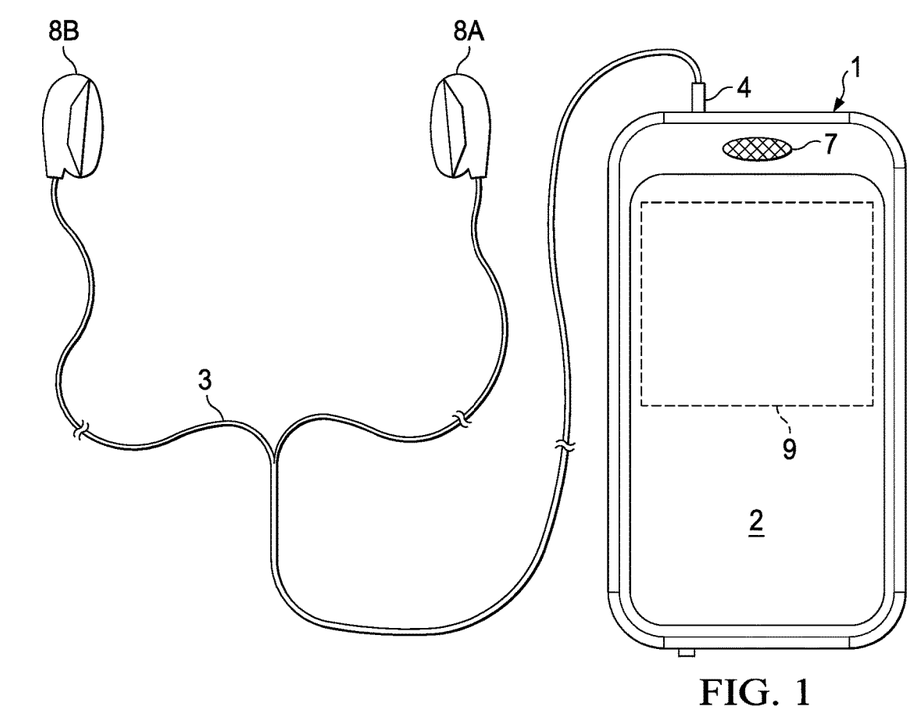
FIG. 1 illustrates an example personal mobile device, in accordance with embodiments of the present disclosure.

FIG. 1 illustrates an example personal mobile device 1, in accordance with embodiments of the present disclosure. FIG. 1 depicts personal mobile device 1 having a speaker 7. Speaker 7 is merely an example, and it is understood that personal mobile device 1 may be used in connection with a variety of transducers including magnetic coil loudspeakers, piezo speakers, haptic feedback transducers, and others. In addition or alternatively, personal mobile device 1 may be coupled to a headset 3 in the form of a pair of earbud speakers 8A and 8B. Headset 3 depicted in FIG. 1 is merely an example, and it is understood that personal mobile device 1 may be used in connection with a variety of audio transducers, including without limitation, headphones, earbuds, in-ear earphones, and external speakers. A plug 4 may provide for connection of headset 3 to an electrical terminal of personal mobile device 1. Personal mobile device 1 may provide a display to a user and receive user input using a touch screen 2, or alternatively, a standard liquid crystal display (LCD) may be combined with various buttons, sliders, and/or dials disposed on the face and/or sides of personal mobile device 1. As also shown in FIG. 1, personal mobile device 1 may include an integrated circuit (IC) 9 for generating an analog signal for transmission to speaker 7, headset 3, and/or another transducer.

Figure 2A:
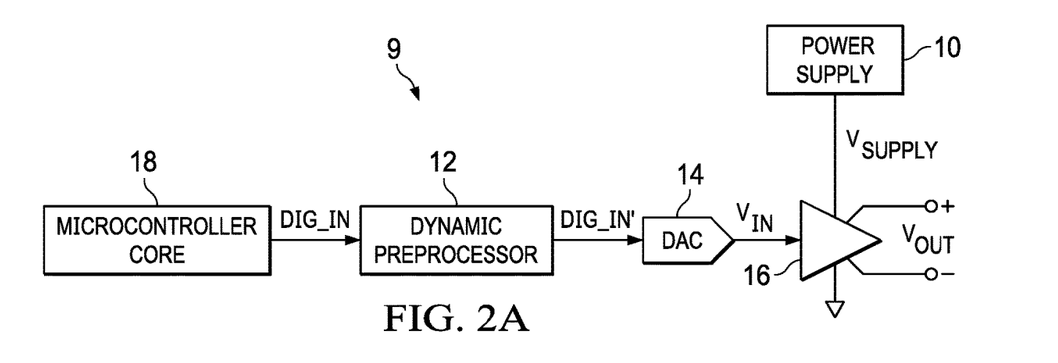
FIG. 2A illustrates a block diagram of selected components of an example integrated circuit of a personal mobile device for driving a transducer, in accordance with embodiments of the present disclosure.

FIG. 2A illustrates a block diagram of selected components of an example audio IC 9 of a personal mobile device for driving a transducer, in accordance with embodiments of the present disclosure. As shown in FIG. 2A, a microcontroller core 18 may supply a digital input signal DIG_IN to a dynamic preprocessor 12, which may perform preprocessing of digital input signal DIG_IN to generate preprocessed digital input signal DIG_IN'. In operation, as described in greater detail elsewhere in this disclosure, dynamic preprocessor 12 may preprocess digital input signal DIG_IN to limit a voltage and/or current of an audio output signal output to an audio transducer in order to reduce distortion in the audio output signal. For example, portions of an audio signal may be attenuated by dynamic preprocessor 12 to prevent a voltage or current of the audio output signal from exceeding a maximum voltage or current of an amplifier (e.g., amplifier 16) of the audio driver. Limiting the signal in such a way may prevent the amplifier from overheating and/or prevent the amplifier from introducing undesirable distortion to an audio output of audio IC 9 which may negatively impact audio quality.

Preprocessed digital input signal DIG_IN' may be received by a digital-to-analog converter (DAC) 14, which may convert the preprocessed digital input signal DIG_IN' into an equivalent analog input signal $V_{IN}$. DAC 14 may in turn supply analog signal $V_{IN}$ to an amplifier 16 which may amplify or attenuate analog input signal $V_{IN}$ to provide a differential audio output signal \Tour, which may operate a speaker, a headphone transducer, a piezoelectric transducer, a haptic feedback transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a switched-mode power converter, as described in greater detail below.

Although FIGS. 1 and 2 contemplate that audio IC 9 resides in a personal mobile device, systems and methods described herein may also be applied to electrical and electronic systems and devices other than a personal mobile device, including transducer systems for use in a computing device larger than a personal mobile device, an automobile, a building, or other structure. For example, audio IC 9 may be used in stage electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like. In some embodiments, audio IC 9 may drive a transducer or load other than an audio transducer.

Furthermore, although FIG. 2A contemplates that dynamic preprocessing takes place in the digital domain of the signal path of audio IC 9, in some embodiments, dynamic preprocessing may take place in the analog domain, in which case an analog dynamic preprocessor may exist in the signal path between DAC 14 and amplifier 16 and may include analog circuit components analogous to the digital components described herein.

Figure 2B:
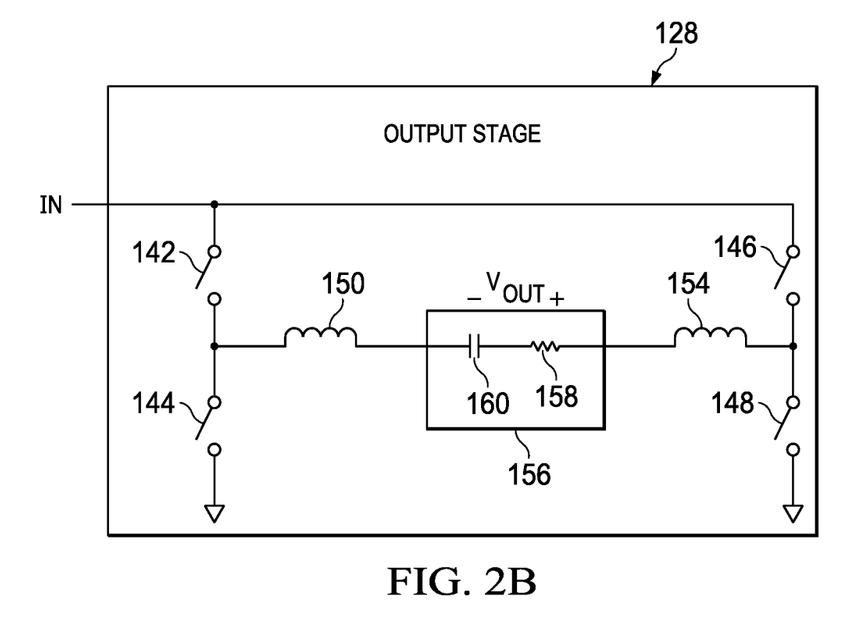
FIG. 2B illustrates a circuit diagram of selected components of an example amplifier output stage, in accordance with embodiments of the present disclosure.

FIG. 2B illustrates a circuit diagram of selected components of an example amplifier output stage 128, in accordance with embodiments of the present disclosure. In some embodiments, amplifier output stage of FIG. 2B may be used to implement at least a portion of amplifier 16 of FIG. 2A. Output stage 128 may receive at its input an input voltage IN, and may generate at its output an output voltage \Tom'. In some embodiments, output stage 128 may comprise a full-bridge Class-D output stage as shown in FIG. 2B, including switches 142, 144, 146, and 148, inductors 150 and 154, and output load 156 driven by output stage 128. In FIG. 2B, output load 156 is represented as a piezoelectric transducer modeled as a resistor 158 in series with a capacitor 160. When implemented as a piezoelectric transducer, output load 156 may comprise any system, device, or apparatus made with one or more materials configured to, in accordance with the piezoelectric effect, generate electric potential or voltage when mechanical strain is applied to such piezoelectric transducer, or conversely to undergo mechanical displacement or change in size or shape (e.g., change dimensions along a particular plane) when a voltage (e.g., output voltage $V_{OUT}$) is applied to the piezoelectric transducer. Accordingly, depending on functionality of personal mobile device 1, in operation, the piezoelectric transducer may, responsive to electronic signals received by amplifier 16, generate acoustic energy in the form of audible sound external to personal mobile device 1, thus acting as an output loudspeaker (e.g., speaker 7) for personal mobile device 1. Additional description of the functionality of such a piezoelectric transducer and systems and methods for integrating such a piezoelectric transducer into a mobile device are disclosed in U.S. patent application Ser. No. 15/822,712, filed Nov. 27, 2017, and incorporated by reference herein.

Figure 3:
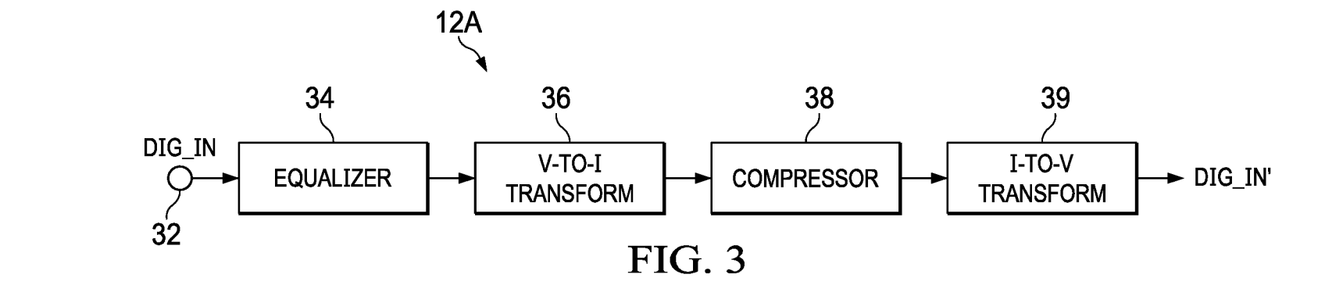
FIG. 3 illustrates a block diagram of selected components of an example dynamic preprocessor circuit, in accordance with embodiments of the present disclosure.

FIG. 3 illustrates a block diagram of selected components of an example dynamic preprocessor circuit 12A, in accordance with embodiments of the present disclosure. In some embodiments, dynamic preprocessor circuit 12A of FIG. 3 may be used to implement dynamic preprocessor circuit 12 of FIG. 2A. As shown in FIG. 3, digital audio input signal DIG_IN may be received at an input 32 and processed by an equalizer 34, which may apply audio processing effects to digital audio input signal DIG_IN. Voltage-to-current transform circuit 36 may receive the equalized digital audio input signal and may transform the equalized audio signal from a voltage domain to a current domain. For example, in embodiments in which the equalized audio signal is a digital signal, the z-domain response of voltage-to-current transform circuit 36 may be approximated by $1-0.99z^{-1}$ or any other suitable approximation. Compressor circuit 38 may receive the current-domain audio signal from voltage-to-current transform circuit 36. In some embodiments, compressor circuit 38 may operate in a limiter mode of operation, modifying or otherwise processing the current-domain audio signal so that the resulting signal does not exceed a maximum amplitude in the current domain. For example, compressor circuit 38 may compress (e.g., attenuate) the audio signal in the current domain. As a specific example, compressor circuit 38 may attenuate specific frequency bands of the audio signal. In some embodiments, compressor circuit 38 may comprise a limiter and may attenuate the audio signal to prevent an amplitude of the signal from exceeding a maximum amplitude. In these and other embodiments, the current-domain audio signal may be compressed based, at least in part, on one or more operating parameters of amplifier 16 (including a load driven by amplifier 16) to prevent portions of the current-domain audio signal that exceed the operating parameters of amplifier 16 from being clipped and/or prevent amplifier 16 from exceeding its thermal limits. Compressor circuit 38 may output the compressed audio signal to a current-to-voltage transform circuit 39 configured to transform the compressed audio signal back to the voltage domain and output the resulting signal as preprocessed digital audio input signal DIG_IN'. Current-to-voltage transform circuit 39 may be the inverse of the voltage-to-current transform circuit 36, and thus the z-domain response of current-to-voltage transform circuit 39 may be approximated by $1/(1-0.99z^-1)$ or any other suitable approximation. In some embodiments, compressor circuit 38 may compress the audio signal in the voltage domain without conversion by transform circuits 36, 39. In other embodiments, an additional compressor (not shown) may be included to compress the signal in the voltage domain before or after the signal is compressed in the current domain by compressor 38. For example, the additional compressor may limit an amplitude of the audio signal in the voltage domain. The current-to-voltage transform circuit 39 may output preprocessed digital audio input signal DIG_IN' to DAC 14 of FIG. 2A to convert digital audio input signal DIG_IN' into equivalent analog input signal $V_{IN}$. As described above, DAC 14 may in turn supply analog signal $V_{IN}$ to an amplifier 16 which may amplify or attenuate analog input signal $V_{IN}$ to provide a differential audio output signal $V_{OUT}$. Thus, amplifier 16 may amplify a voltage domain compressed audio signal and may output such amplified audio signal to a transducer. Such transducer may then generate audio based on the received amplified audio signal. The transducer may, for example, be a piezoelectric transducer which may be approximated as a purely or predominantly capacitive load for purposes of audio signal processing. Alternatively, the transducer may be another type of reactive load. The danger of excessive current that might exceed operational parameters of an amplifier (e.g., amplifier 16) may relate to audio signals with large high frequency energy, as for a highly capacitive load, a load current $i_{OUT}$ may be estimated given by:

$$i_{OUT}=C(dv_{OUT}/dt)$$

where C equals a capacitance of the load, and $dv_{OUT}/dt$ is the mathematical derivative with respect to time of audio output signal $V_{OUT}$. As $dv_{OUT}/dt$ is larger for higher-frequency signal content, currents associated with higher-frequency content may be larger and more susceptible to exceeding operational parameters of an amplifier, even when the magnitude of the voltage itself may not exceed such operational parameters. Accordingly, compression of the audio signal by dynamic preprocessing circuit 12A may reduce or eliminate altogether any distortion and/or thermal overload that may have been caused by a current of the audio signal exceeding a maximum current parameter of the amplifier.

In other words, voltage-to-current transform circuit 36 may calculate a mathematical derivative of a voltage-domain audio signal with respect to time to generate a current-domain signal, compressor circuit 38 may limit a magnitude of such mathematical derivative (thus limiting current), and current-to-voltage transform circuit 39 may perform mathematical integration of the limited signal to transform back to the voltage domain.

Although audio IC 9 is described above as an audio driver circuit, other types of signals may be processed using a voltage-to current transform circuit, a compressor circuit, and a current-to-voltage transform circuit as described above to limit an amplitude of a signal.

Figure 4:
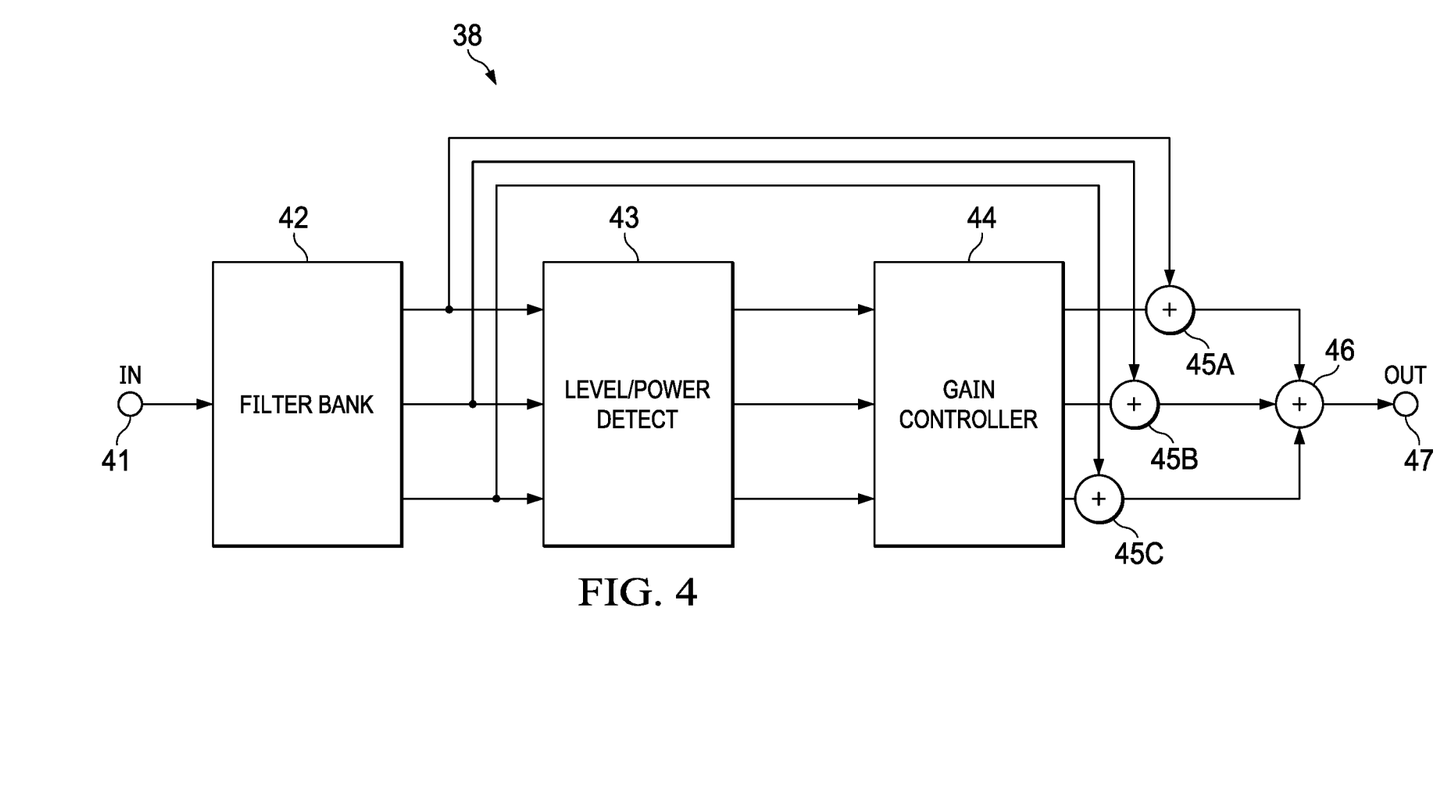
FIG. 4 illustrates a block diagram of selected components of an example signal compressor circuit, in accordance with embodiments of the present disclosure.

Compressor circuit 38 may compress the audio signal as a whole or may separate the signal into a plurality of frequency bands for compression, as shown in FIG. 4 and described in greater detail below. FIG. 4 illustrates a block diagram of selected components of an example signal compressor circuit 38, in accordance with embodiments of the present disclosure. In some embodiments, compressor circuit 38 of FIG. 4 may be used to implement compressor circuit 38 of FIG. 3.

As shown in FIG. 4, compressor circuit 38 may receive an audio signal IN at input 41. The received audio signal IN may be an audio signal in the current domain. A filter bank 42 may split audio signal IN into a plurality of component frequency bands. Although FIG. 4 shows filter bank 42 splitting audio signal IN into three frequency bands, filter bank 42 may split audio signal IN into any suitable number of component frequency bands. A level/power detect circuit 43 may receive the component frequency bands and may be configured to determine a level of each of the plurality of frequency bands and/or a power of each of the plurality of frequency bands. Level/power detect circuit 43 may output a power of each of the plurality of frequency bands and/or a level of each of the plurality of frequency bands to a gain calculator circuit 44.

Gain calculator circuit 44 may determine a gain to apply to each of the plurality of component frequency bands based, at least in part, on the power of each frequency band received from level/power detect circuit 43. In some embodiments, gain calculator circuit 44 may determine a gain to apply to each of the plurality of component frequency bands based, alternatively or additionally, on the level of each of the plurality of frequency bands determined by level/power detect circuit 43. In these and other embodiments, gain calculator circuit 44 may determine a gain for each of the component frequency bands based on one or more parameters of an amplifier (e.g., amplifier 16) of an audio driver circuit. For example, gain calculator circuit 44 may determine a gain for each of the component frequency bands based on a maximum power and/or maximum current for each of the plurality of component frequency bands. The maximum power and/or maximum current for each of the plurality of component frequency bands may be set based, at least in part, on one or more operational parameters of an amplifier or a transducer of the audio driver circuit. As an example, the maximum power and/or maximum current for each of the plurality of component frequency bands may be set based on a maximum power and/or maximum current of an amplifier (e.g., amplifier 16) of an audio driver circuit to avoid signal clipping and/or thermal overload. Gain calculator circuit 44 may then determine a gain for each of the component frequency bands to adjust the audio signal so that each of the component frequency bands do not exceed a maximum power and/or maximum current of such amplifier.

Gain calculator circuit 44 may output a gain for each of the component frequency bands to each of multipliers 45A-C. Multipliers 45A-C may apply each gain to a respective component frequency band. A summer 46 may sum each of the component frequency bands adjusted by the applied gain to generate a single compressed audio output signal OUT and may output the compressed audio signal OUT to output 47.

Figure 5:
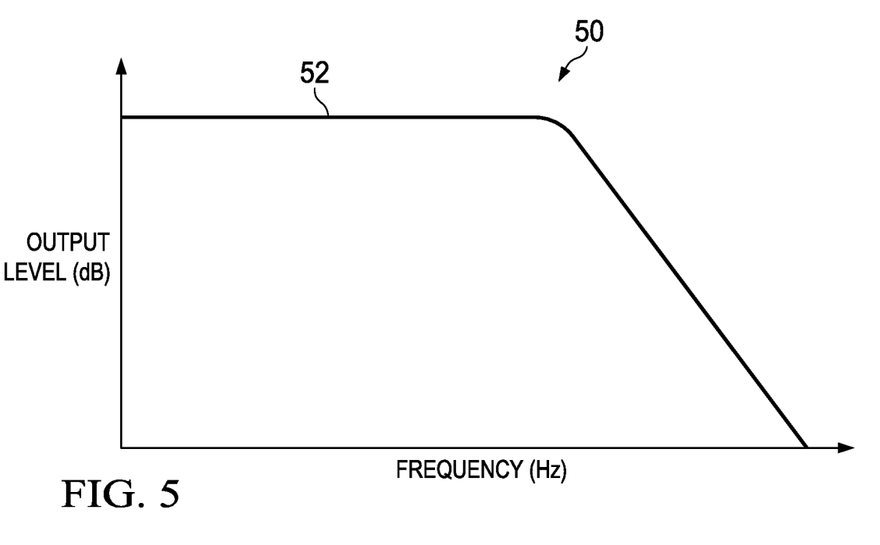
FIG. 5 is a graph illustrating an example frequency profile of audio output by a transducer coupled to a current-limiting audio integrated circuit, in accordance with embodiments of the present disclosure.

To avoid clipping of an audio signal and/or thermal overload by an amplifier (e.g., amplifier 16) of an audio driver circuit, high-frequency portions of an audio signal may be attenuated using the apparatus and methods described herein. Attenuation of the audio signal may, for example, be based on one or more properties of the amplifier such as frequency-specific signal amplification capabilities of the amplifier maximum current handling capability of the amplifier, or maximum temperature capability of the amplifier. Some amplifiers may be limited in their ability to amplify signals of higher frequencies which can introduce distortion, negatively impacting audio quality, and/or cause thermal overload, endangering the amplifier. For example, if a power level (or other metric) of a frequency band of the audio signal exceeds the capabilities of the amplifier, the amplifier may clip the audio signal, introducing distortion and/or causing thermal overload. Thus, using the apparatus and methods described herein, portions of an audio signal may be attenuated before reaching an amplifier to avoid clipping and/or thermal overload. An example frequency profile 52 of an audio signal processed by the apparatus and/or methods described herein is shown in the graph 50 of FIG. 5. Frequency profile 52 shown in FIG. 5 may be a frequency profile of a full-scale chirp signal (e.g., sine wave input) swept across a frequency range. As depicted in FIG. 5, the output level of the audio signal may not be attenuated for lower frequencies. However, as the frequency increases, the audio signal may be attenuated, to avoid clipping and/or thermal overload by an amplifier (e.g., amplifier 16). Thus, a large frequency band of the audio signal may be passed to the amplifier without attenuation, while greater attenuation is applied to higher frequencies of the audio signal, and accordingly, clipping of the audio signal and/or thermal overload of the amplifier may be avoided.

Figure 6:
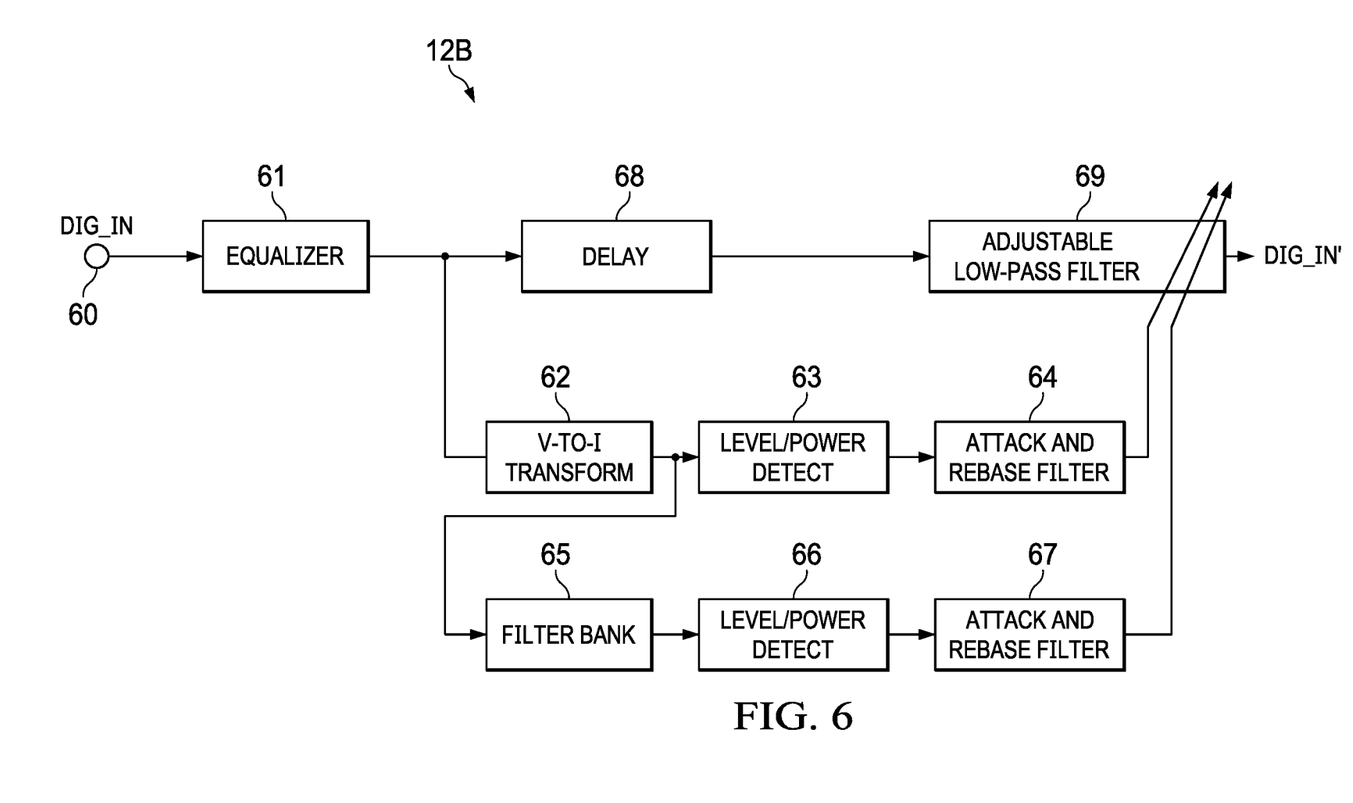
FIG. 6 illustrates a block diagram of selected components of another example dynamic preprocessor circuit, in accordance with embodiments of the present disclosure.

FIG. 6 illustrates a block diagram of selected components of another example dynamic preprocessor circuit 12B, in accordance with embodiments of the present disclosure. In some embodiments, dynamic preprocessor circuit 12B of FIG. 6 may be used to implement dynamic preprocessor circuit 12 of FIG. 2A. As shown in FIG. 6, digital audio input signal DIG_IN may be received at an input 60 and processed by an equalizer 61, which may apply audio processing effects to digital audio input signal DIG_IN. Voltage-to-current transform circuit 62 may receive the equalized digital audio input signal and may transform the equalized audio signal from a voltage domain to a current domain. For example, in embodiments in which the equalized audio signal is a digital signal, the z-domain response of voltage-to-current transform circuit 62 may be approximated by $1-0.99z^{-1}$ or other suitable approximation.

A level/power detect circuit 63 may receive the current domain signal generated by voltage-to-current transform circuit 62 and may be configured to determine a level of such current domain signal and/or a power of such current domain signal.

An attack and release filter 64 may receive the level/power determined by level/power detect circuit 63 and may generate control signals for controlling a frequency response of adjustable low-pass filter 69 based, at least in part, on the power of the signal received from level/power detect circuit 63. In some embodiments, attack and release filter 64 may generate control signals for controlling a frequency response of adjustable low-pass filter 69 based, alternatively or additionally, on the level of the signal received from level/power detect circuit 63. In these and other embodiments, attack and release filter 64 may generate control signals based on one or more parameters of an amplifier (e.g., amplifier 16) of an audio driver circuit. For example, level/power detect circuit 63 may determine that for frequency content of an audio signal above a particular frequency, a current to be driven exceeds one or more operational parameters of an amplifier (e.g. amplifier 16) or a transducer of an audio driver circuit. Accordingly, together level/power detect circuit 63 and attack and release filter 64 may generate control signals for adjustable low-pass filter 69 to compress (e.g., attenuate) certain frequency content of the audio signal to avoid distortion and/or thermal overload that may occur if the current exceeds the one or more operational parameters, as described in greater detail below.

In addition or alternatively to level/power detect circuit 63 receiving the current domain signal generated by voltage-to-current transform circuit 62, a filter bank 65 may receive the current domain signal generated by voltage-to-current transform circuit 62 and split such current domain signal into a plurality of component frequency bands. Although FIG. 6 shows filter bank 65 splitting the current domain signal into two frequency bands, filter bank 65 may split the current domain signal into any suitable number of component frequency bands. A level/power detect circuit 66 may receive the component frequency bands and may be configured to determine a level of each of the plurality of frequency bands and/or a power of each of the plurality of frequency bands. Level/power detect circuit 66 may output a power of each of the plurality of frequency bands and/or a level of each of the plurality of frequency bands to an attack and release filter 67.

Attack and release filter 67 may generate control signals for controlling a frequency response of adjustable low-pass filter 69 based, at least in part, on the individual powers of the plurality of frequency bands received from level/power detect circuit 66. In some embodiments, attack and release filter 67 may generate control signals for controlling a frequency response of adjustable low-pass filter 69 based, alternatively or additionally, on the individual levels of the plurality of frequency bands received from level/power detect circuit 66. In these and other embodiments, attack and release filter 67 may generate control signals based on one or more parameters of an amplifier (e.g., amplifier 16) of an audio driver circuit. For example, level/power detect circuit 66 may determine that for frequency content of an audio signal at particular frequency ranges, a current to be driven exceeds one or more operational parameters of an amplifier (e.g., amplifier 16) or a transducer of an audio driver circuit. Accordingly, together level/power detect circuit 66 and attack and release filter 67 may generate control signals for adjustable low-pass filter 69 to compress (e.g., attenuate) certain frequency content of the audio signal to avoid distortion that may occur if the current exceeds the one or more operational parameters, as described in greater detail below.

A delay circuit 68 may also receive the equalized digital audio input signal from equalizer 61 and add a delay to the signal to compensate for the latency inherent in generating the control signals for adjustable low-pass filter 69 described above.

Figure 7A:
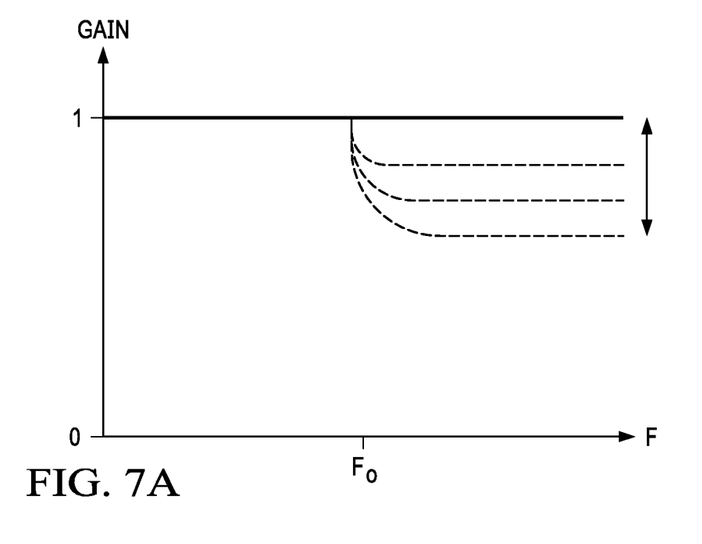
FIGS. 7A-7C are each a graph illustrating an example response of an adjustable low-pass filter, in accordance with embodiments of the present disclosure.
Figure 7B:
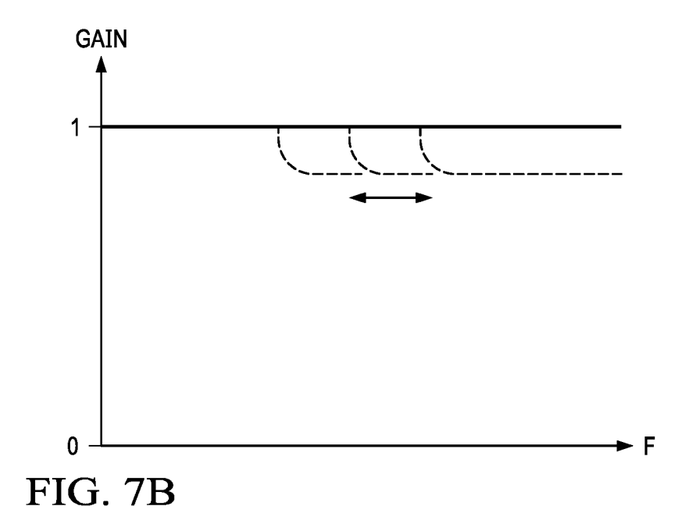
Figure 7C:
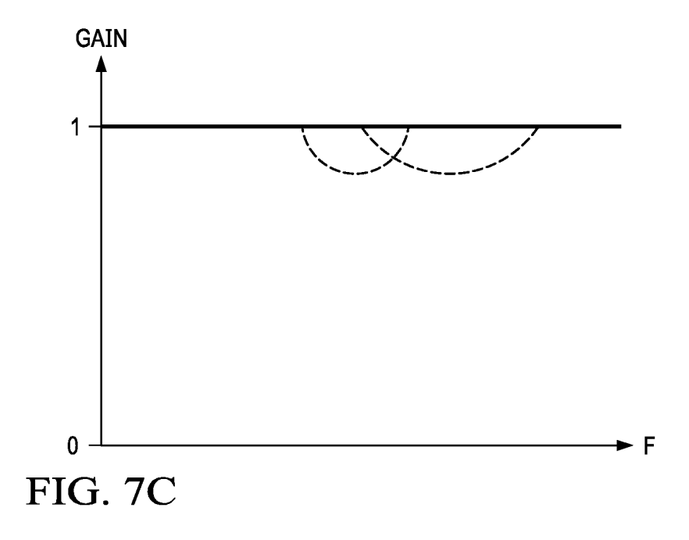

Adjustable low-pass filter 69 may comprise any suitable filter configured to compress one or more frequency ranges of the delayed equalized digital audio input signal, as indicated by control signals received from attack and release filter 64 and/or attack and release filter 67. For example, adjustable low-pass filter 69 may provide for variable filtering of an audio signal as shown in one or more of FIGS. 7A-7C. FIGS. 7A-7C are each a graph illustrating an example response of adjustable low-pass filter 69, in accordance with embodiments of the present disclosure. In some embodiments, adjustable low-pass filter 69 may be controlled such that for frequencies above a particular frequency $f_0$, a variable attenuation is applied as shown in FIG. 7A. In these and other embodiments, adjustable low-pass filter 69 may be controlled such that attenuation is applied for frequencies above a variable controlled frequency as shown in FIG. 7B. In these and other embodiments, adjustable low-pass filter 69 may be controlled such that attenuation is applied in one or more variable frequency ranges as shown in FIG. 7C.

Figure 8:
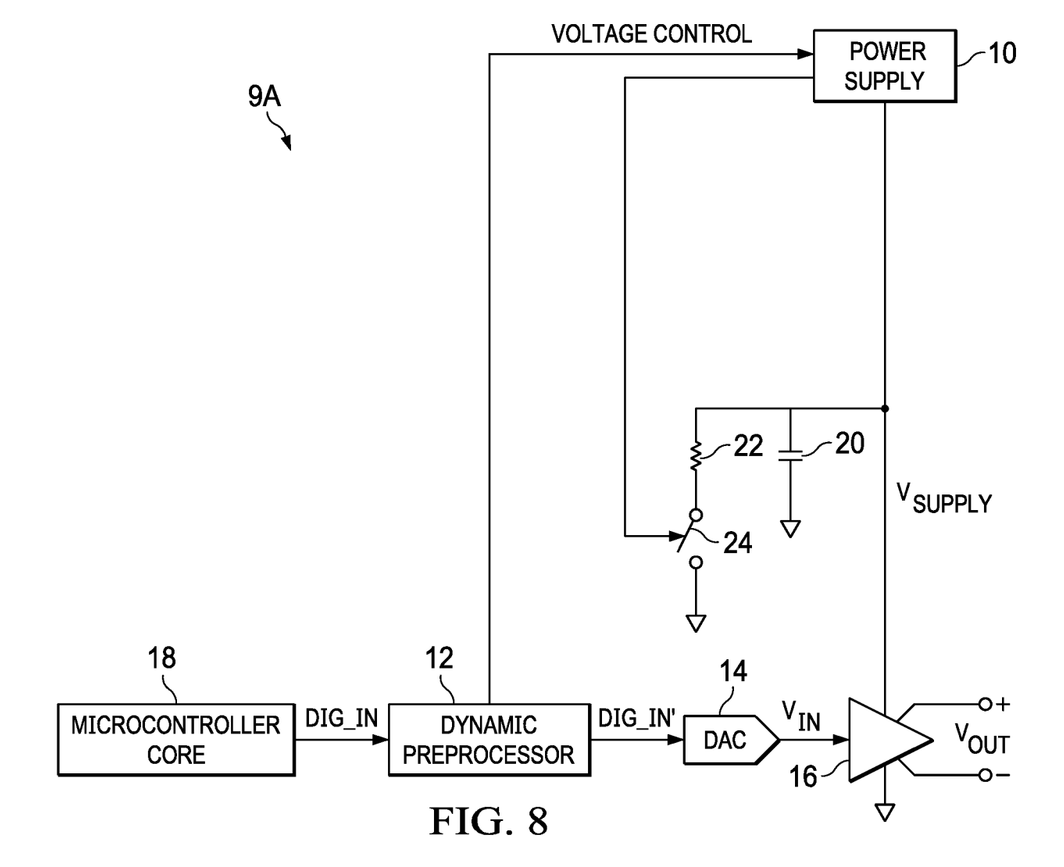
FIG. 8 illustrates a block diagram of selected components of another example integrated circuit of a personal mobile device for driving a transducer, in accordance with embodiments of the present disclosure.

FIG. 8 illustrates a block diagram of selected components of an example audio IC 9A of a personal mobile device for driving a transducer, in accordance with embodiments of the present disclosure. Audio IC 9A depicted in FIG. 8 may be similar in all material respects to audio IC 9 of FIG. 2A, and thus, only key differences between audio IC 9A and audio IC 9 are described herein. Notably, in audio IC 9A, dynamic preprocessor 12 may communicate a voltage control signal to power supply 10. Such voltage control signal may be indicative of a magnitude of audio output signal $V_{OUT}$, such that power supply may output a variable supply voltage $V_{SUPPLY}$ which tracks an envelope of audio output signal $V_{OUT}$, such as is the case when amplifier 16 is implemented as a Class-G or Class-H amplifier. Further, when power supply 10 is implemented using a boost converter for boosting a voltage supplied by a battery or other power source to supply voltage $V_{SUPPLY}$, power supply 10 may output the boosted supply voltage $V_{SUPPLY}$ to a capacitor 20, as shown in FIG. 8. Also as depicted in FIG. 8, audio IC 9A may include a dump circuit implemented as a resistor 22 in series with a switch 24 coupled between resistor 22 and a ground voltage and controlled by power supply 10. Functionality of such dump circuit is described in greater detail below.

In embodiments in which audio IC 9A drives a predominantly capacitive load, as is the case with a piezoelectric transducer, such load may store electrical energy. When a voltage on such capacitive load is increased, the energy in the load must increase, and such energy may be sourced from capacitor 20 and power supply 10. When voltage on such capacitive load decreases, energy from the load may be returned to capacitor 20, which increases a voltage on capacitor 20. Furthermore, system energy losses may be increased whenever the voltage on capacitor 20 is greater than that required to support a maximum voltage required for the load. Accordingly, it may be desirable to coordinate supply voltage $V_{SUPPLY}$ with the signal level of output voltage $V_{OUT}$. However, such coordination must not be performed in a way so as to clip amplifier 16 in voltage or exceed the limit of current available out of amplifier 16 or power supply 10. As most of the energy of the load may be returned to capacitor 20 on each half audio cycle, power supply 10 may only need to supply the system losses and any energy needed to increase voltage on capacitor 20.

In order to have output voltage $V_{OUT}$ as large as possible, and capacitor 20 to have a physical size as small as possible, the energy returned to capacitor 20 from the load may need to be dissipated or thrown away. Such dissipation of energy may be performed, when needed, by the dump circuit, for example by enabling (e.g., activating, closing, turning on) switch 24 such that some of the energy from capacitor 20 is dissipated by resistor 22.

Such dissipation of energy may cause significant loss if performed at high frequency. By limiting the high-frequency amplitude of the audio signal such that dissipation is controlled, and dumping energy for high-voltage, low-frequency signals, the voltage level for typical audio content may be optimized. Audio IC 9A as shown in FIG. 8 may allow for the joint optimization of dissipation at low signal levels (e.g., by reducing the boosted voltage on capacitor 20), operation at high program magnitude levels (by co-optimizing voltage and necessary dissipation of energy), and protection from high loss with high-frequency test signals.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system comprising:
    an input configured to receive a first signal representative of a second signal to be driven to an amplifier input of an amplifier;
    processing circuitry configured to process the first signal in order to generate the second signal from the first signal such that the processing circuitry limits a current driven by the amplifier to an output load of the amplifier, wherein the processing circuitry limits the current driven to the output load by:
        calculating from the first signal a quantity representative of a time rate of change of the first signal;
        limiting the quantity; and
        mathematically integrating the quantity to generate the second signal; and
    an output configured to drive the second signal to the amplifier input.

2. The system of claim 1, wherein the first signal and the second signal are both voltage-domain signals.

3. The system of claim 2, wherein the processing circuitry comprises:
a voltage-to-current transform circuit configured to transform the first signal from a voltage domain to a current domain to create a current-domain representation of the first signal;
a signal compressor coupled to an output of the voltage-to-current transform circuit and configured to compress the current-domain representation of the first signal; and
a current-to-voltage transform circuit coupled to an output of the signal compressor and configured to transform the current-domain representation of the first signal to the voltage domain to create the second signal as a compressed voltage-domain representation of the first signal.

4. The system of claim 3, wherein the signal compressor comprises a signal limiter.

5. The system of claim 3, wherein the signal compressor comprises:
a filter bank configured to separate the current-domain representation of the first signal into a plurality of component frequency bands;
a level/power detect circuit configured to determine at least one of a power and a level for each of the plurality of component frequency bands;
a gain calculator configured to determine a gain for each of the plurality of component frequency bands based, at least in part, on the determined power or level and to apply the determined gain to each of the plurality of component frequency bands; and
a summer configured to sum the plurality of component frequency bands after the determined gain is applied to each of the plurality of component frequency bands in order to generate the second signal.

6. The system of claim 1, wherein the processing circuitry comprises:
an adjustable low-pass filter configured to generate the second signal from the first signal; and
control circuitry configured to control a response of the adjustable low-pass filter based on at least one of a power and a level for the first signal.

7. The system of claim 6, wherein the control circuitry comprises:
a filter bank configured to separate a current-domain representation of the audio signal into a plurality of component frequency bands;
a level/power detect circuit configured to determine at least one of a power and a level for each of the plurality of component frequency bands; and
an attack and release filter configured to generate at least one control signal to control the response based on the determined power or level for each of the plurality of component frequency bands.

8. The system of claim 1, wherein the first signal and second signal comprise audio signals.

9. The system of claim 1, wherein the processing circuitry is further configured to limit the current driven to the output load based on one or more operational parameters of the amplifier.

10. The system of claim 1, wherein the output load is predominantly capacitive.

11. The system of claim 1, wherein the output load is an audio transducer.

12. The system of claim 1, wherein the output load is a piezoelectric transducer.

13. A method comprising:
receiving a first signal representative of a second signal to be driven to an amplifier input of an amplifier;
processing the first signal in order to generate the second signal from the first signal in order to limit a current driven by the amplifier to an output load of the amplifier, wherein processing limits the current driven to the output load by:
calculating from the first signal a quantity representative of a time rate of change of the first signal;
limiting the quantity; and
mathematically integrating the quantity to generate the second signal; and
driving the second signal to the amplifier input.

14. The method of claim 13, wherein the first signal and the second signal are both voltage-domain signals.

15. The method of claim 14, wherein processing comprises:
transforming the first signal from a voltage domain to a current domain to create a current-domain representation of the first signal;
compressing the current-domain representation of the first signal; and
transforming the current-domain representation of the first signal to the voltage domain to create the second signal as a compressed voltage-domain representation of the first signal.

16. The method of claim 15, wherein compressing comprises limiting the current-domain representation of the first signal.

17. The method of claim 15, wherein compressing comprises:
separating the current-domain representation of the first signal into a plurality of component frequency bands;
determining at least one of a power and a level for each of the plurality of component frequency bands;
determining a gain for each of the plurality of component frequency bands based, at least in part, on the determined power or level and to apply the determined gain to each of the plurality of component frequency bands; and
summing the plurality of component frequency bands after the determined gain is applied to each of the plurality of component frequency bands in order to generate the second signal.

18. The method of claim 13, wherein processing:
generating the second signal from the first signal with an adjustable low-pass filter; and
controlling a response of the adjustable low-pass filter based on at least one of a power and a level for the first signal.

19. The method of claim 18, controlling the response comprises:
separating a current-domain representation of the audio signal into a plurality of component frequency bands;
determining at least one of a power and a level for each of the plurality of component frequency bands; and
generating, with an attack and release filter, at least one control signal to control the response based on the determined power or level for each of the plurality of component frequency bands.

20. The method of claim 13, wherein the first signal and second signal comprise audio signals.

21. The method of claim 13, wherein processing further comprises limiting the current driven to the output load based on one or more operational parameters of the amplifier.

22. The method of claim 13, wherein the output load is predominantly capacitive.

23. The method of claim 13, wherein the output load is an audio transducer.

24. The method of claim 13, wherein the output load is a piezoelectric transducer.

* * * * *